United States Patent
Roca I Cabarrocas et al.

(10) Patent No.: US 7,964,438 B2
(45) Date of Patent: Jun. 21, 2011

(54) METHOD FOR FORMING A FILM WITH A GRADED BANDGAP BY DEPOSITION OF AN AMORPHOUS MATERIAL FROM A PLASMA

(75) Inventors: Pere Roca I Cabarrocas, Villebon sur Yvette (FR); Pavel Bulkin, Villebon sur Yvette (FR); Dmitri Daineka, Palaiseau (FR); Patrick Leempoel, Brussels (BE); Pierre Descamps, Rixensart (FR); Thibault Kervyn De Meerendre, Brussels (BE)

(73) Assignees: Dow Corning Corporation, Midland, MI (US); Ecole Polytechnique, Palaiseau (FR)

( * ) Notice: Subject to any disclaimer, the term of this patent is extended or adjusted under 35 U.S.C. 154(b) by 0 days.

(21) Appl. No.: 12/447,842

(22) PCT Filed: Oct. 26, 2007

(86) PCT No.: PCT/EP2007/009305
§ 371 (c)(1),
(2), (4) Date: Jul. 29, 2009

(87) PCT Pub. No.: WO2008/052705
PCT Pub. Date: May 8, 2008

(65) Prior Publication Data
US 2010/0062561 A1    Mar. 11, 2010

(30) Foreign Application Priority Data
Nov. 2, 2006    (EP) .................................... 06301117

(51) Int. Cl.
*H01L 21/00* (2006.01)
(52) U.S. Cl. .......................................... 438/96; 438/482

(58) Field of Classification Search .................... 438/96, 438/87, 57, 482, 484, 485
See application file for complete search history.

(56) References Cited

U.S. PATENT DOCUMENTS
4,910,153 A * 3/1990 Dickson ........................ 438/96
(Continued)

FOREIGN PATENT DOCUMENTS
CN           87100729          11/1987
(Continued)

OTHER PUBLICATIONS

Daineka, D., et al., "Control and Monitoring of Optical Thin Films Deposition in a Matrix Distributed Electron Cyclotron Resonance Reactor," European Physical Journal, Applied Physics EDP Sciences France, vol. 28, No. 3, Dec. 2004, pp. 343-346.

(Continued)

*Primary Examiner* — Charles D Garber
*Assistant Examiner* — Reema Patel
(74) *Attorney, Agent, or Firm* — Leason Ellis LLP

(57) ABSTRACT

A method is described of forming a film of an amorphous material on a substrate by deposition from a plasma. The substrate is placed in an enclosure, a film precursor gas is introduced into the enclosure, and unreacted and dissociated gas is extracted from the enclosure so as to provide a low pressure therein. Microwave energy is introduced into the gas within the enclosure to produce a plasma therein by distributed electron cyclotron resonance (DECR) and cause material to be deposited from the plasma on the substrate. The said flow rate of the film precursor gas is altered during the course of deposition of material, so as to cause the bandgap to vary over the thickness of the deposited material.

13 Claims, 6 Drawing Sheets

U.S. PATENT DOCUMENTS

| | | | |
|---|---|---|---|
| 5,429,685 | A | 7/1995 | Saito et al. |
| 5,536,914 | A | 7/1996 | Pelletier et al. |
| 5,666,023 | A | 9/1997 | Pelletier et al. |
| 5,686,734 | A * | 11/1997 | Hamakawa et al. ............ 257/16 |
| 6,274,461 | B1 * | 8/2001 | Guha et al. .................... 438/478 |
| 6,407,359 | B1 | 6/2002 | Lagarde et al. |
| 2002/0022349 | A1 | 2/2002 | Sugiyama et al. |
| 2003/0194508 | A1 | 10/2003 | Carpenter et al. |
| 2004/0247948 | A1 | 12/2004 | Behle et al. |
| 2010/0075458 | A1 * | 3/2010 | Roca I Cabarrocas et al. . 438/96 |

FOREIGN PATENT DOCUMENTS

| | | |
|---|---|---|
| EP | 0233613 | 8/1987 |
| EP | 0487114 | 5/1992 |
| EP | 1075168 | 2/2001 |
| GB | 2083701 | 3/1982 |
| JP | 05314918 | 11/1993 |
| JP | 10081968 | 3/1998 |
| WO | WO-2008/052703 | 5/2008 |
| WO | WO-2008/052704 | 5/2008 |
| WO | WO-2008/052706 | 5/2008 |
| WO | WO-2008/052707 | 5/2008 |
| WO | WO-2008/052708 | 5/2008 |
| WO | WO-2008/053271 | 5/2008 |

OTHER PUBLICATIONS

Daineka, D., et al., "High density plasma enhanced chemical vapour deposition of thin films" European Physical Journal—Applied Physics, vol. 26, No. 1, Apr. 2004, pp. 3-9, XP002462386.

"Compact Microwave Plasma Source" IBM Technical Disclosure Bulletin, IBM Corp. New York, US, vol. 35, No. 5, Oct. 1, 1992, pp. 307-308, XP000312985 ISSN; 0018-8689.

Bulkin, P., et al., "Plasma enhanced chemical vapour deposition of silica thin films in an integrated distributed electron cyclotron resonance reactor" Preparation and Characterization, Elsevier Sequoia, NL, vol. 308-309, Oct. 31, 1997, pp. 63-67, XP004524338 ISSN: 0040-6090.

Jes Asmussenjr et al: "The Design and Application of Electron Cyclotron Resonance Discharges" IEEE Transactions on Plasma Science, IEEE Service Centre, Piscataway, JN, US, vol. 25, No. 6, Dec. 1997, XP011044935 ISSN: 00933813.

Bechu S et al: "Multi-dipolar plasmas for plasma-based ion implantation and deposition" Surface & Coatings Technology Elsevier Switzerland, vol. 186, No. 1-2, Aug. 2, 2004, pp. 170-176, XP0024261912 ISSN: 0257-8972.

Bardos L et al: "Microwave Surfatron Systems for Plasma Processing" Journal of Vacuum Science and Technology: Part A, AVS/AIP, Melville, NY, US, vol. 14, No. 2, Mar. 1, 1996, pp. 474-477, X000620528 ISSN: 0734-2101.

Sakudo N et al: "Development of hybrid pulse plasma coating system" Surface and Coatings Technology Elsevier Switzerland, vol. 136, No. 1-3, Feb. 2, 2001, pp. 23-27, XP002427492 ISSN: 02578972.

Awazu K et al: "Films formed by hybrid pulse plasma coating (HPPC) system" AIP Conference Proceedings AIP USA, No. 576, 2001, pp. 955-598, XP002427493 ISSN: 094-243X.

Bulkin P et al: "Deposition of silicon alloys in an integrated distributed electron cyclotron resonance reactor: Oxide, nitride, oxinitrides, and multilayer structures" Journal of Vacuum Science and Technology A.Vacuum, Surfaces and Films, American Institute of Physics, New York, NY, US, vol. 20, No. 2, Mar. 2002, pp. 338-343, PX012005960 ISSN: 0734-2101.

Girard G et al, "Matrix-distributed ECR-PECVD for high-rate deposition of silica for applications in integrated optics" Proceedings of the SPIE—The International Society for Optical Engineering SPIE—Int. Soc. Opt. Eng USA, vol. 4944, 2003, pp. 62-71, PX002436134 ISSN: 0277-786X.

Shing Y H et al: "Electron Cyclotron Resonance Microwave Plasma Deposition of A-SI:H and ASIC: H Films" Solar Cells, Elsevier Sequoia SA, Lausanne, CH, vol. 30, No. 1/4, May 1, 1991, pp. 391-401, XP000243420.

Plais F et al: "Low Temperature Deposition of SIO2 by Distributed Electron Cyclotron Resonance Plasma-Enhanced Chemical Vapor Deposition" Journal of the Electrochemical Society, Electrochemical Society, Manchester, New Hampshire, US, vol. 139, No. 5, May 1, 1992, pp. 1489-1495, XP000355387ISSN: 0013-4651.

Lagarde, T, et al., "Determination of the EEDF by Langmuir Probe diagnostic in a plasma excited at ECR above a multipolar magnetic field", Plasma Sources Sci. Technol. 10, 181-190, 2001.

Moisan & Pelletier, "Microwave Excited Plasmas,"Elsevier, 1992, Appendix 9.1 pp. 269-271.

Fontcuberta, A., et al., "Structure and hydrogen content of polymorphous silicon thin films studied by spectroscopic ellipsometry and nuclear measurements" Physical Review B 69,125307/1-10, 2004.

Rafat, N. et al., "The limiting efficiency of band gap graded solar cells" Solar Energy Materials & Solar Cells, 55(1998) 341-361.

Foelsch, J., et al., Conference Record of the IEEE Photovoltaic Specialists Conference (1996) 25th 133-1136.

Dalal, V. et al., "Improvements in stability of a-silicon solar cells through the use of band gap grading" Conference Record of IEEE Photovoltaic Specialists Conference (1993), 23rd 806-20.

Suzuki et al, "Radio-frequency biased microwave plasma etching technique: A method to increase SiO2 etch rate", J Vac. Sci. Technol. B 3(4), 1025-1033, Jul./Aug. 1985.

* cited by examiner

METHOD FOR FORMING A FILM WITH A GRADED BANDGAP BY DEPOSITION OF AN AMORPHOUS MATERIAL FROM A PLASMA

CLAIM OF PRIORITY

This application is a U.S. national phase application under 35 U.S.C. §371 of International Patent Application No. PCT/EP2007/009305 filed Oct. 26, 2007, and claims the benefit of priority of EP Patent Application No. 06301117.5 filed Nov. 2, 2006, the disclosures of all of which are hereby incorporated by reference in their entireties. The International Application was published in English on May 8, 2008 as WO 2008/052705.

This invention relates to a method for forming a film of an amorphous material by deposition from a plasma on to a work surface. More particularly, it concerns the use of microwave energy to produce the plasma by electron cyclotron resonance. One area of particular interest is in depositing a film of amorphous silicon (a-Si:H) by dissociation of a silane, for example $SiH_4$, $Si_2H_6$ or a higher order of oligomer, in a process known as plasma-enhanced CVD (chemical vapor deposition). Other precursor gases which can be used to deposit amorphous silicon, or amorphous silicon alloys, include molecules in which silicon is present in combination with one or more carbon, oxygen, or nitrogen, optionally together with hydrogen. An example of a silicon alloy is a structure of the type denoted by $SiO_xN_y$. Further, silicon-containing gases may be used together with other gases, for example germane, or gases not containing silicon may be used to deposit other films. One area of particular interest as regards the use of amorphous silicon films in is devices for converting solar energy into electrical power. Such amorphous silicon material can also find use in electronic applications such as TFT for display. As used herein, the term "amorphous silicon" denotes hydrogenated amorphous silicon, a-Si:H. For use in the areas just mentioned, some hydrogen must be present, typically 3-20%, to passivate the dangling bonds which are defects.

In the technical field of exciting a plasma to electron cyclotron resonance (hereinafter abbreviated to "ECR"), resonance is obtained when the frequency of gyration of an electron in a static or quasi-static magnetic field is equal to the frequency of the applied accelerating electric field. This resonance is obtained for a magnetic field B at an excitation frequency f which is related to B by the following relationship:

$$B=2\pi mf/e \qquad (1)$$

wherein m and e are the mass and the charge of an electron.

When exciting a plasma at electron cyclotron resonance frequency electrons revolve in phase with the electric field and continuously gain energy from the external excitation source where the ECR condition (1) is met such as to reach the threshold energy necessary for dissociating or ionizing the gas. To satisfy this condition, it is necessary firstly that the electron remains trapped in the magnetic field lines, i.e. that its radius of gyration is small enough with respect to the static magnetic field gradient for the electron to see a substantially constant magnetic field during its gyration, and secondly that the frequency of gyration remains large relative to the frequency of collision between electrons and neutral elements such as atoms and/or molecules. In other words, the best conditions for exciting a plasma to electron cyclotron resonance are expected to be obtained when simultaneously the gas pressure is relatively low and the excitation frequency f is high, which also means that the magnetic field intensity B must be high.

A major difficulty with conventional divergent ECR is that it is not possible to produce a plasma whose density is substantially uniform over a large area. This means that it cannot be used, for example, to deposit a substantially uniform layer of material on a work surface of large size. To overcome this problem, a technique has been developed which is known as distributed electron cyclotron resonance (DECR), which employs an apparatus in which a plurality of plasma excitation devices is formed into a network, with the devices collectively generating a plasma whose density is substantially uniform at the work surface. The individual plasma excitation devices are each constituted by a wire applicator of microwave energy, having one end connected to a source for producing microwave energy and having an opposite end fitted with at least one magnetic dipole for creating at least one surface having a magnetic field that is constant and of an intensity corresponding to electron cyclotron resonance. The dipole is mounted at the end of the microwave applicator in such a manner as to ensure that electrons accelerated to electron cyclotron resonance oscillate between the poles so as to create a plasma diffusion zone situated on the side of the dipole that is remote from the end of the applicator. The individual excitation devices are distributed relative to one another and in proximity with the work surface so as to create together a plasma that is uniform for the work surface.

Such a DECR apparatus is described in U.S. Pat. No. 6,407,359 (corresponding to EP-1075168), and more detailed discussion of the apparatus described therein is given below, with reference to drawings. As is apparent from those drawings, excitation devices, as viewed from the substrate, take the form of a generally rectangular array, by which we include the particular case where the rectangle is a square, and such an apparatus is therefore sometimes referred to as matrix DECR (MDECR) apparatus. It is to be understood, however, that the present invention could also be applied to a DECR apparatus where the excitation devices were arranged in a non-rectangular two-dimensional network, for example a hexagonal network or where there are two parallel lines of devices, with the devices in one line being offset with respect to one another. An example of a hexagonal array is given in "Determination of the EEDF by Langmuir probe diagnostic in a plasma excited at ECR above a multipolar magnetic field", T. Lagarde, Y. Arnal, A. Lacoste, J. Pelletier, Plasma Sources Sci. Technol. 10, 181-190, 2001. The devices could also be disposed as a circular, part-circular, or near-circular array. It should be noted that, in some work done by the present inventors, depositions have been carried out with a central plasma excitation device being surrounded by three or six devices, the surrounding devices having the polarity of their magnets being oppositely disposed to the magnet of the central device and being arranged in a triangular or hexagonal array respectively. Furthermore, the invention can be applied to a DECR apparatus which is not of an MDECR type. Thus, for example, it is applicable to a DECR reactor which, historically, preceded the MDECR type, and which has a cylindrical shape and uses long antennas and magnets that extend from the top to the bottom of the cylinder. Such arrangement is described in "Microwave Excited Plasmas" by Michel Moisan and Jacques Pelletier, Elsevier, 1992, and would be suitable for homogeneously coating a cylindrical substrate such as a tube but also a flat surface lying in the central part of the plasma and oriented perpendicular to the axis of the cylinder.

A thin film solar cell typically comprises an intrinsic layer (an i-layer) of an amorphous material, for example based on silicon, sandwiched between a p-doped layer (p-layer) and a n-doped layer (n-layer), and it is known that the conversion efficiency of the solar cell depends on, amongst other things, the bandgap of the amorphous material. Where the amorphous material has a constant bandgap throughout its thickness, a small bandgap provides larger sunlight collection and hence larger conversion efficiency. However, it is also known that an advantageous structure can be obtained if the bandgap varies in an appropriate fashion over the intrinsic layer thickness. This is known as a graded bandgap. By way of further background to the present invention, there is now set out below a discussion of the role of bandgap in solar cells, and why a graded bandgap may be valuable. It is to be understood that although the ensuing discussion focuses on an intrinsic layer in which there are a substantial number of layers of differing bandgap, the invention is also applicable to the case where there are just two layers differing in bandgap to one another, for example where most of the intrinsic layer is of constant bandgap and there is a relatively thin layer of different bandgap adjacent either the p-layer or p-layer, for example a buffer layer of higher bandgap adjacent the p-layer. In addition the intrinsic layer can be made of two or more regions, not all of the regions having a graded bandgap structure. It is also to be noted that although the specific examples of the invention given below involve the deposition of a finite number of discrete layers, with a step change in bandgap from one layer to the next, the invention is also applicable to a method in which the bandgap changes steplessly through all or part of its thickness.

As indicated above, the active part of thin film solar cells made of Si material includes three layers: the p-doped layer, the intrinsic layer and the n-doped layer. As presented in the energy band diagram of FIG. 10, the presence of the p and n-doped layers at the extremities of the intrinsic layer distorts the conduction and the valence bands and creates an electrical field. The holes (present in the valence band) drift toward the p-doped layer while the free electrons (present in the conduction band) drift toward the n-doped layer.

It is well known that the mobility and the lifetime of the holes are significantly lower than for the electrons. In particular, the mobilities are 0.01 and 1 $cm^2/V/s$ respectively for holes and electrons in good a-Si:H material. Thus, when an electron-hole pair is generated far from the p-layer, holes collection becomes critical. Therefore, grading the intrinsic layer from a low bandgap material close to the p-doped layer to a large bandgap material close to the n-doped layer is very beneficial for the holes collection, due to the increased electric field driving the charge carrier drift, which increases the probability that a hole which is generated will then be collected, and hence is beneficial for the overall cell performance.

Consideration also needs to be given to the way in which light absorption by amorphous silicon varies with wavelength. Since a-Si:H light absorption decreases with wavelength, the blue light is more strongly absorbed than the red. If the cell is illuminated through the p or the n-layer, the blue light is absorbed respectively close to the P/I or the N/I interface while the red light is more uniformly absorbed throughout the thickness of the intrinsic layer. Also, the optical absorption of the sunlight decreases when the bandgap increases because photons having an energy smaller than the bandgap cannot be absorbed by the material. Therefore, increasing the bandgap of the intrinsic material from the p-doped to the n-doped layer reduces the optical absorption, particularly in the yellow-red part of the sunlight spectrum. Accordingly, when illuminating the cell through the p-doped layer, fewer electron/hole pairs are generated in the second half of the intrinsic thickness in a graded gap cell as compared to a non-graded gap one. However, as explained above, this direction of grading increases the probability that the holes which are generated are then collected, and this can more than compensate for the fact that fewer holes are generated. When a cell is illuminated from the n-doped layer this same direction of gradient will still be advantageous, since it will still enhance the holes collection but also the light absorption will be better spread throughout the intrinsic layer depth, hence closer to the P/I interface than for non-graded cells illuminated from the p-layer.

Graded bandgap junctions are also of interest for multi junction devices. In such devices, the different junctions are typically connected in series with each other (see FIG. 11), and the junctions must then be tuned to have identical current. The front junction will absorb the shortest wavelengths and then have the largest bandgap while the back junctions will absorb the longest wavelengths and have smaller bandgap.

A review of the field of compositionally graded bandgap solar cells is provided in N. Rafat, S. E.-D. Habib, "The limiting efficiency of band gap graded solar cells" Solar Energy Materials & Solar Cells, 55 (1998) 341-361. Most of the studies reported were on $Ga_{1-x}Al_xAs$ material and on a-Si alloys, especially a-SiGe. Indeed, it is well known that a-SiGe:H material is characterized by a large number of defects due to the network mismatch between Si and the Ge atoms. The main result of the published literature is that grading the band gap enhances the cell efficiency through enhancement of the collection of minority carriers and the reduction of surface recombination rates.

Different types of bandgap grading of the i-layer, for example linear profiling in asymmetric v- and u-form, have been studied in the art with respect to their influence on the solar cell parameters (see, for example, Foelsch, J.; Stiebig, H.; Finger, F.; Rech, B.; Lundszien, D.; Labertz, A.; Wagner. Conference Record of the IEEE Photovoltaic Specialists Conference (1996), $25^{th}$ 1133-1136). The shape of the bandgap profile has a major effect on the cell performance as can be shown by displacing the location of the region of smallest gap along the axis of the intrinsic layer. The grading profile has a profound effect on both the fill factor and the open-circuit voltage. Optimum performance has been found for an asymmetric v-shape with a bandgap minimum close to the p-i interface, as shown in FIG. 12.

Various methods have been proposed for making graded bandgap structures. Thus, for example, graded bandgap Si alloys are disclosed in GB-A-2083701. In these structures the bandgap of the Si material is graded by introducing at least one bandgap adjusting element (i.e. Ge, Sn, C or N).

Another prior art document which discusses graded bandgaps is V. Dalal, G. Baldwin, P. Garikepati, "Improvements in stability of a-silicon solar cells through the use of bandgap grading" Conference Record of IEEE Photovoltaic Specialists Conference (1993), $23^{rd}$ 816-20. This explains that the well-known degradation of a-Si:H cells is a result of additional defects creation in the intrinsic layer upon light excitation. These additional defects have two consequences:

(i) They act has additional recombination centers, thereby reducing the lifetimes of the electrons and holes, and hence, reduce the diffusion lengths of these carriers.

(ii) They shift the field distribution in the cell, reducing the electrical field in the middle and increasing it slightly at the p and n interfaces of a PIN a-Si:H cell.

The second issue is solved in this reference with a graded bandgap structure. After the p-layer and the large bandgap a-SiC:H buffer, the a-Si:H intrinsic layer is deposited in 3 steps:

(i) A constant low bandgap (preferably 1.65 eV) layer of 100-150 nm is deposited at 350° C.

(ii) A graded bandgap region where the bandgap is changed to about 1.8 eV over 120-150 nm is achieved by lowering the deposition temperature by 100° C. and increasing the dilution ratio (i.e. $H_2/SiH_4$).

(iii) A constant bandgap intrinsic region of 100-150 nm followed by the n-layer are both deposited at 275° C.

All the layers are deposited by RF triode glow discharge with the substrate being isolated from the plasma by a grid. The deposition rate was very low (probably ~1 Å/s), making possible the drop of 100° C. during 100 nm of deposition. Such a drop is not possible with DECR because the deposition rate is of the order of 25 times faster, making it impossible to lose 100° C. within one minute.

The Dalal et al reference quoted above also explains that the grading of the bandgap is beneficial for the stabilization of the cell efficiency. The reference quotes the degradation of a standard cell and a graded cell as being 27% and 20% respectively after 35 hours 7× Sun (xenon) illumination.

The present invention arises from the discovery that when a DECR process is used to deposit a film of amorphous silicon the bandgap of the deposited material increases when the flow rate of the film precursor gas decreases, and vice versa. Although it has previously been noted that there was a dependence of bandgap on flow rate in other types of film deposition process (it has been found that in hot wire chemical vapor deposition (HW-CVD) increasing the silane flow tends to increase the bandgap, and that in divergent ECR the opposite is true), the relationship in the case of DECR was not previously known, and it had not previously been thought to produce a graded bandgap, whether using DECR or any other technique, by varying the flow rate of the film precursor gas during the deposition of that film.

It is believed that, although described here with reference to the deposition of a film of amorphous silicon, the process would also be applicable to the deposition of films of other amorphous materials, e.g. amorphous germanium and amorphous carbon.

Accordingly, the present invention provides a method of forming a film of an amorphous material on a substrate by deposition from a plasma, which comprises placing the substrate in an enclosure, continuously introducing into the enclosure a film precursor gas at a flow rate, and extracting unreacted and dissociated gas from the enclosure so as to provide a low pressure in the enclosure, and introducing microwave energy into the gas within the enclosure to produce a plasma therein by distributed electron cyclotron resonance (DECR) and cause material to be deposited from the plasma on the substrate, wherein the said flow rate is altered during the course of deposition of material, so as to cause the bandgap to vary over the thickness of the deposited material.

One consequence of this is that if the film precursor gas contains more than one component gas, the overall flow rate of the multi-component gas must vary with time, though the composition of the precursor gas (i.e. the relative amounts of the individual components) need not, and preferably does not, vary. It is to be noted, however, that, subject to this, the reference to the bandgap being graded by varying the flow rate is not intended to exclude the possibility that the grading effect produced by varying the bandgap may be supplemented by additional grading produced by other mechanisms. One such mechanism is described in our copending application filed on the same date as the present application and entitled "Method for forming a film with a graded bandgap by deposition of an amorphous material from a plasma using distributed electron cyclotron resonance" (Our reference G28555EP (European Patent Application No. 06301119.1)). That application describes how the bandgap may be varied by varying the frequency and/or power of a pulsed microwave supply. It is also to be noted that the invention covers both the production of a film in which the bandgap varies though all or part of its thickness in one or more steps (by varying the flow rate in a stepped fashion), and the case where the bandgap varies through all or part of the thickness of the film in a continuous, stepless fashion (by varying the flow rate in a continuous, stepless fashion).

The invention is further described below with reference to the accompanying drawings, in which.

Figure 1:
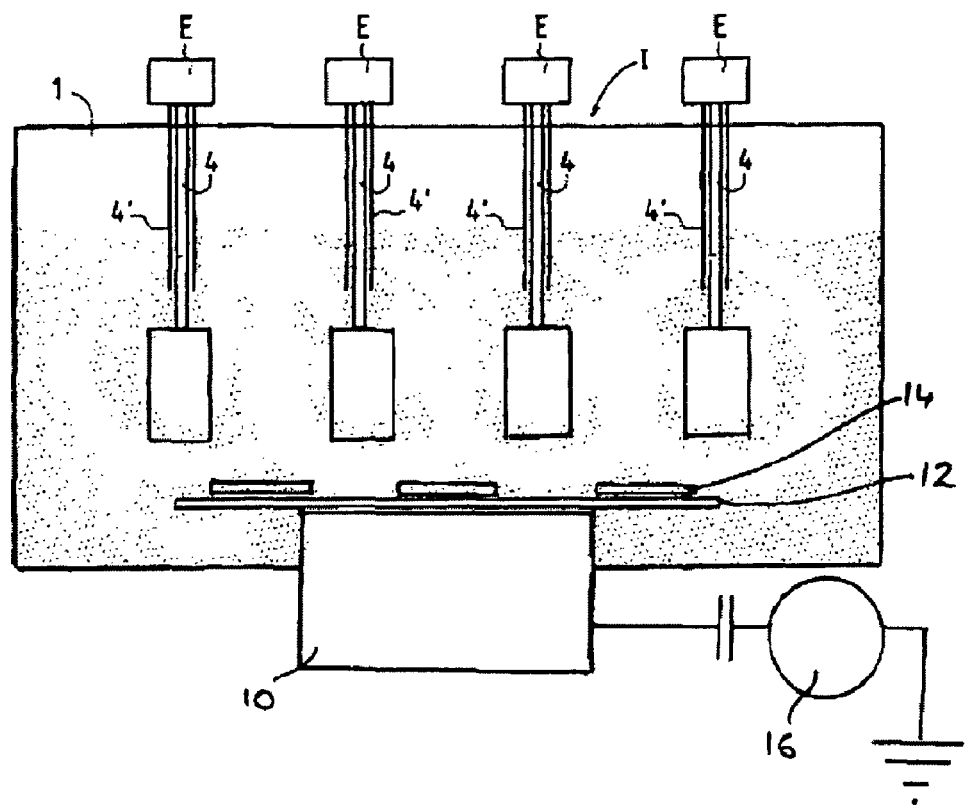
FIG. 1 is a diagrammatical elevation view showing a plasma production apparatus as described and shown in EP-1075168, omitting the means for introducing and extracting gas, which are shown separately in FIG. 3.
Figure 2:
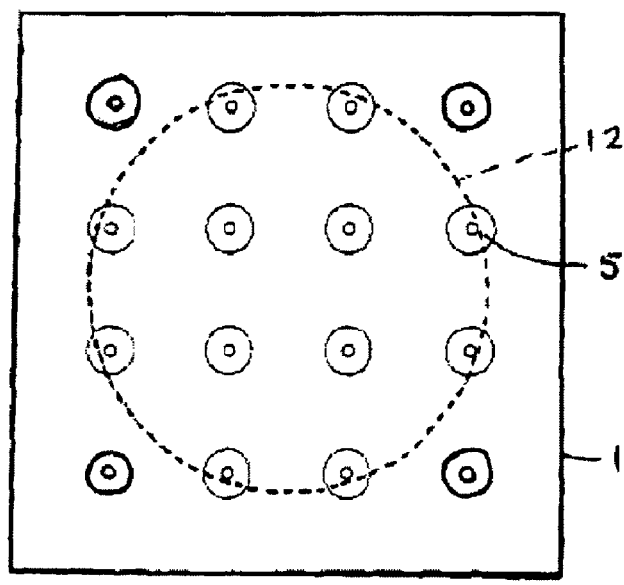
FIG. 2 is a plan view of the apparatus of FIG. 1.

FIGS. 1 and 2 show an apparatus for producing a plasma relative to a substrate on which a film is to be deposited. The apparatus comprises a sealed enclosure 1 represented diagrammatically and fitted with devices for admitting gas and for pumping gas out (not shown in FIG. 1), that enable the pressure of the gas that is to be ionized or dissociated to be maintained at a desired value which, for example, can be about $10^{-2}$ to $2 \times 10^{-1}$ Pascals, depending on the nature of the gas and the excitation frequency. However, gas pressures less than $10^{-2}$ Pa (say down to $10^{-4}$ Pa, for example), or above $2 \times 10^{-1}$ Pa (say up to $5 \times 10^{-1}$ Pa, or even 1 Pa or more) can be used. For example, pumping can be carried out by a 1600 l/s Alcatel Turbo-molecular pump, which serves to extract gas from the enclosure.

Gas is admitted to the enclosure from an appropriate gas source, e.g. a cylinder of gas under pressure, under the control of a mass flow controller (MFC). The gas may, for example, comprise $SiH_4$ as a film precursor gas, or one of the other gases mentioned above in relation to the deposition of amorphous silicon. In addition to the film precursor there may also be introduced a non-reactive diluent gas, such as He, Ne or Ar, a reactive gas, such as hydrogen, nitrogen or oxygen, or a dopant gas such as diborane, trimethyl boron or phosphine.

Typically, any such other gases are introduced into the enclosure through the same port or ports as the film precursor gas, as a mixture therewith, but they could be introduced separately. The gas feeding system should ensure the appropriate flow of gases, which typically range from 1 to 1000 sccm (standard cubic centimeter per minute), into the reactor.

The injection port for the gas generally consists of a single tube, or a plurality of tubes, entering the deposition chamber. The tube, or each tube, if there is more than one, can be extended by a grid to ensure more even distribution of the gas inside the deposition chamber. Injection can be carried out anywhere in the reactor but it is preferred to direct the film precursor gas towards the substrate surface. As used herein, it is to be understood that the reference to the outlet being arranged to direct gas towards the substrate surface covers not only the case where the gas is aimed directly at the substrate surface on which the film is to be deposited, but also any case where the said surface is wholly within an angle defined between a line extending from the outlet, in the direction of gas flow therefrom, and a line which is at right angles thereto and passes through the outlet. Under such circumstances the gas flow emerging from the outlet will have a vector component towards all portions of the said surface.

Figure 3:
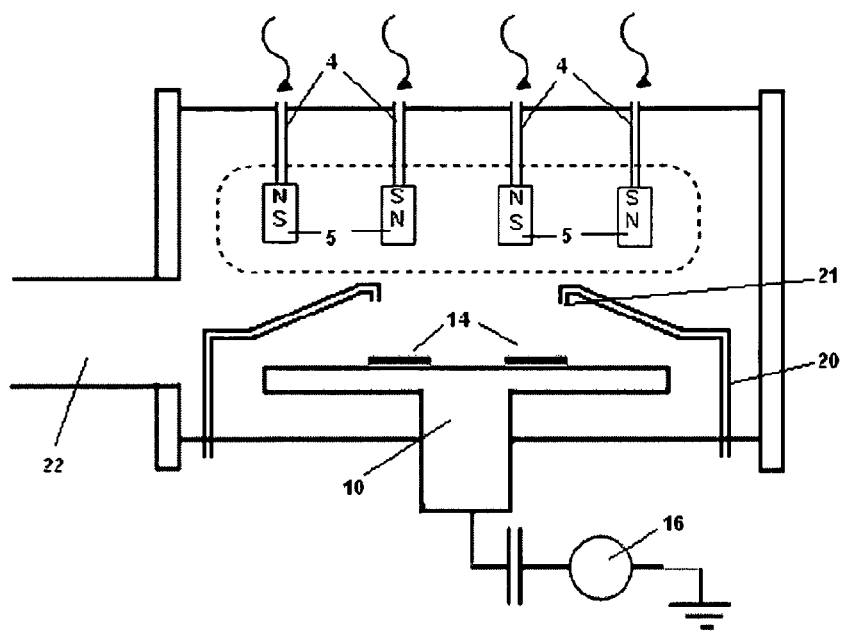
FIG. 3 shows one way of introducing gas into the apparatus and extracting gas from the apparatus.
Figure 4:
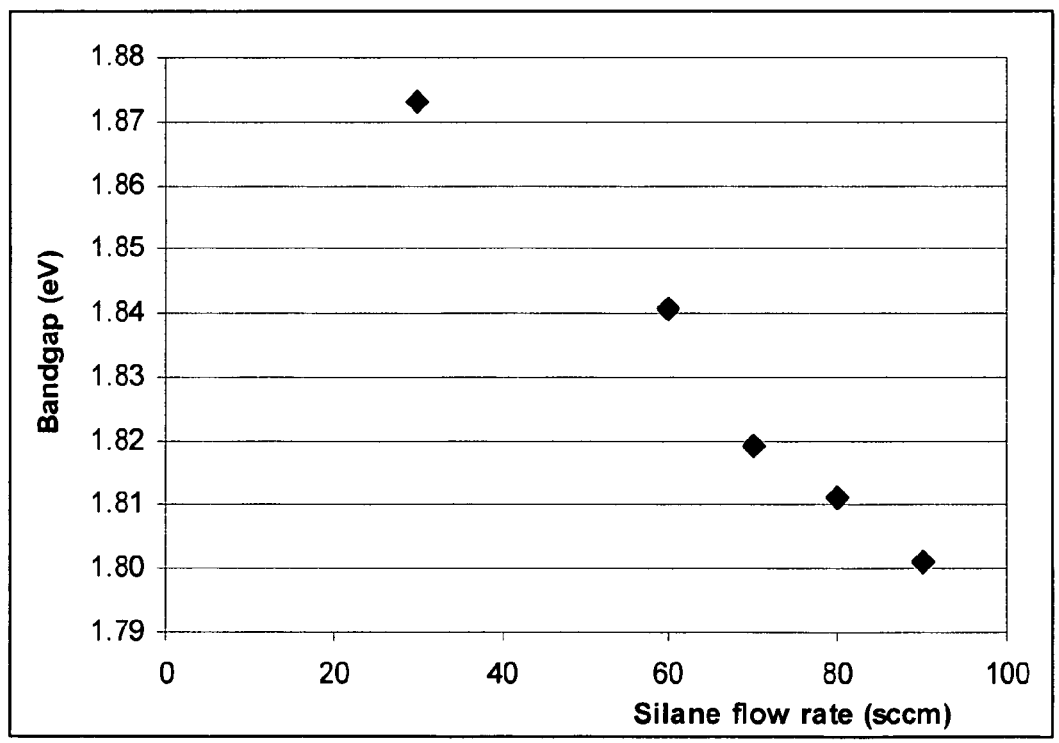
FIGS. 4 and 5 are graphs showing the effect of silane flow rate on material bandgap and the maximum value of the imaginary part of the dielectric function, respectively.
Figure 5:
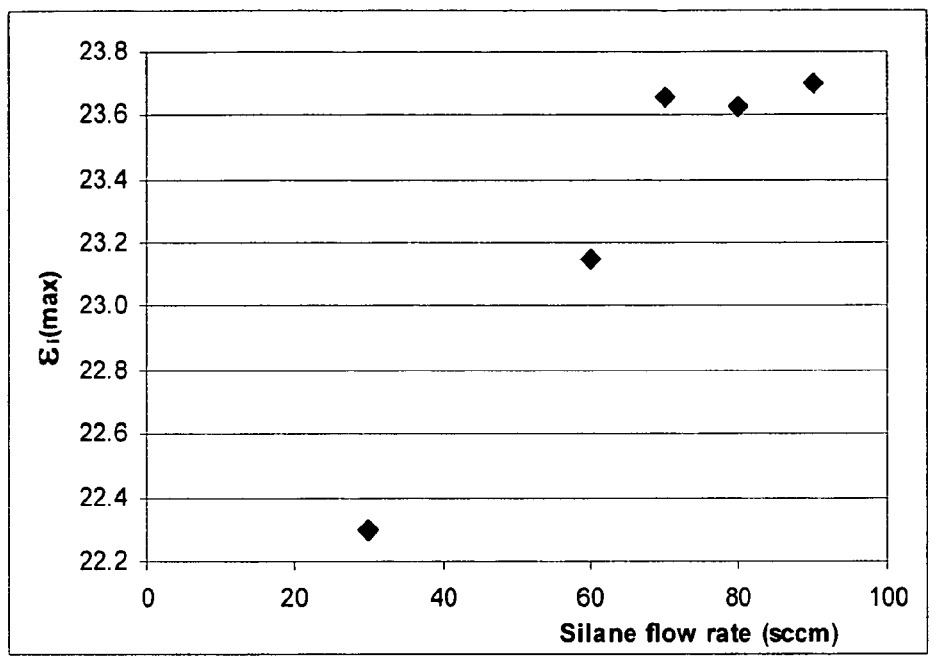

One way of doing this, referred as "point" injection, is shown diagrammatically in FIG. 3. In this arrangement the film precursor is introduced through a pipe, or a plurality of pipes 20 (two are shown), each of which has its outlet 21 located between the hot electron confinement envelope, as herein defined (shown by a broken line) and the substrate surface, and directed towards that surface. FIG. 3 also shows an exit 22 through which residual and dissociated gas is pumped out. Other features of FIG. 3 are described below with reference to the apparatus shown in FIG. 1. Other injection arrangements of particular interest are described in our copending application filed on the same date as the present application and entitled "Method and apparatus for forming a film by deposition from a plasma" (our reference G28331EP (European Patent Application No. 06301115.9)), which describes the relative merits of various injection arrangements.

The plasma chamber is equipped with a substrate holder 10, which is shown as a fixed part of the apparatus. One function of the substrate holder is to heat the substrates to the required deposition temperature. This is typically between room temperature and 600° C., and in the case of the deposition of amorphous silicon is preferably in excess of 200° C., more preferably between 225° C. and 350° C. The temperature being referred to here is the actual substrate temperature, as opposed to the nominal substrate temperature which may be measured by measuring the temperature of the substrate holder. The significance of the distinction is discussed further in our co-pending application filed on the same date as the present application and entitled "Method for forming a film of amorphous silicon by deposition from a plasma" (our reference G27558EP (European Patent Application No. 06301114.2)) mentioned above.

A carrier plate 12, having thereon at least one substrate 14, and optionally a plurality of such substrates, is removably mounted on the holder 10, so that it can be brought into the chamber with substrates to be coated, and removed from the chamber with the substrates after they have been coated. However, alternatively the substrate can be glued directly on the substrate holder, using a thermally conductive glue. This improves thermal contact between the substrate and the substrate holder, which is otherwise difficult to achieve under low pressure conditions. This is discussed further in our co-pending application filed on the same date as the present application and entitled "Method for forming a film of amorphous silicon by deposition from a plasma" (our reference G27558EP (European Patent Application No. 06301114.2)). In this case the holder, with its substrates, needs to be introduced into the enclosure prior to the deposition process, and removed from it afterwards. If gluing is not used, one way to try to improve the heating of the substrate is to precede the low pressure film deposition step by a step in which the enclosure is filled with gas at a relatively high pressure (typically around 100-200 Pa). The high pressure gas provides thermal transfer across whatever gap may exist between the substrate and the heated holder, ensuring initial heating of the substrates. Another possibility is to place a thermally conductive carbon film between the substrate and the substrate holder. The substrate holder can be heated by circulating a hot fluid inside it, but heating could alternatively be achieved by electrical heating resistors embedded in the substrate holder. Alternatively, however, it is possible to heat the substrates directly, for example by using infrared lamps.

Another function of the substrate holder is to allow polarization of the substrate surface such as to control the energy of ions towards the substrate. Polarization can be achieved using either a source of RF voltage or using a DC voltage and requires the substrate holder to be electrically insulated from ground. Polarization is achieved by connecting the electrically insulated substrate holder to an appropriate RF or DC generator 16 with an adequate matching circuit in the case of RF polarization. When depositing on an insulating substrate, or on an insulating layer previously deposited on a substrate (which may or may not be insulating), the use of an RF generator is preferred. When depositing on a conductive substrate or a conductive layer previously deposited on a conductive substrate, which may or may not be conductive, the bias can be applied by either an RF or DC generator with suitable electrical connection to the substrate surface. In a specific embodiment an RF-bias was applied using a 13.56 MHz Dressler generator connected to the substrate holder via an automatic tuning box. Even when using an RF generator, the resulting bias on the substrate surface comprises a DC bias component, as a result of conditions in the plasma. An explanation of how this occurs can be found, in the content of the description of a completely different plasma process, in Suzuki et al, "Radio-frequency biased microwave plasma etching technique: A method to increase $SiO_2$ etch rate", J. Vac. Sci. Technol. B 3(4), 1025-1033, July/August 1985.

The plasma production apparatus I has a series of individual plasma excitation devices E spaced apart from one another and located in the proximity of the substrates, so as to operate together to create a plasma that is uniform for the substrates. Each individual plasma excitation device E comprises an elongate microwave energy applicator 4. Each applicator 4 has one of its ends connected to a respective microwave energy source, which lies outside the enclosure 1. Alternatively, however, a single microwave energy source can feed microwaves to all the applicators 4, or there can be a plurality of energy sources fewer in number than the number of applicators. For example, an array of sixteen applicators can conveniently be fed by two 2.45 GHz microwave generators, each of 2 kW maximum power, and each feeding eight applicators via a power splitter and respective slug tuners. Each applicator 4 is advantageously in the form of a tube surrounded by a coaxial tube 4', thus enabling microwave energy to propagate to the free end thereof while avoiding radiating microwaves, and reducing microwave coupling between the applicators. In order to ensure proper transfer of the microwave energy into the plasma, each applicator is preferably equipped with a matching device that minimizes, or at least reduces, the reflected power from the plasma excitation device.

Each microwave applicator 4 has its free end connected to at least one permanent magnet 5. Each magnet preferably has its magnetic axis parallel to the long axis of the magnet itself. In one particular form of this arrangement all the plasma excitation devices have their magnets oriented in the same direction (a monopolar configuration). i.e. all their north poles are at the top and all their south poles are at the bottom, or vice versa. In another, some of each pole are at the top and some of each pole are at the bottom (a multipolar configuration). An example of the latter is an array, where, viewed from one end as in FIG. 2, and passing along any given row or column of devices, one successively encounters poles of alternate polarity. Yet another example is where all the magnets in a given row (or column) have the same polarity, but the columns (or rows) are of alternative polarity. However, arrangements can also be used where the magnetic axes of the magnets are not parallel to the long axes of the magnets themselves, provided there are significant regions where the lines of the magnetic field are parallel to the propagation vector of microwaves. This is necessary in order to ensure the existence of significant regions where ECR damping can occur.

Experiments were carried out to determine the relationship between film precursor flow rate and the bandgap of the deposited amorphous material. The experiments were carried out using silane as the film precursor gas, without any plasma gas, though the conclusions derived are believed to be valid for other precursor gases, and for a precursor gas when used in combination with a plasma gas. The apparatus used was as shown in FIG. 3.

Depositions were carried out under constant conditions (MW power 2 kW, 16 antennas, −100V bias, applied by an RF voltage source, a nominal temperature 275° C.), except for the silane flow rate which was varied from 60 to 90 sccm. In addition, a trial was performed at 30 sccm but closing the gate valve to increase the gas pressure significantly. The temperature is referred to as the nominal temperature; it was actually the temperature measured at the substrate holder. It is believed (for a further discussion see our copending application filed on the same date as the present application and entitled "Method for forming a film of amorphous silicon by deposition from a plasma" (our reference G27558EP (European Patent Application No. 06301114.2)) that the actual substrate temperature was significantly lower. The data are shown in the Table 1 below.

Figure 6:
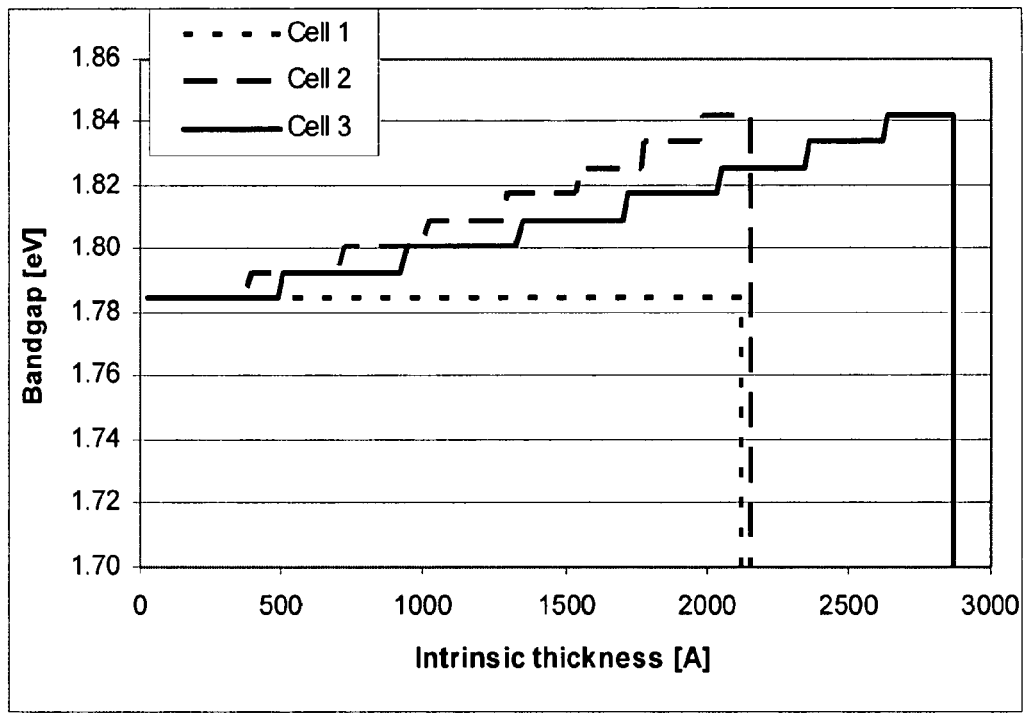
FIG. 6 shows graphs of the variation in bandgap through the thickness of intrinsic layer of three different cells.

Based on this observation of the relationship between precursor gas flow rate and bandgap, NIP cells were deposited in which the intrinsic layer was formed to have a graded bandgap by varying the flow rate during deposition. FIG. 6 is a plot showing how the bandgap of the intrinsic layer varied through the thickness of the intrinsic layer for three different NIP cells, denoted as Cell 1, Cell 2 and Cell 3. The cells were formed by first simultaneously depositing their respective p-layers on a glass substrate consisting of Asahi type U glass, i.e. glass coated with a textured $SnO_2$ layer 900 nm thick, that acts as a transparent front contact on the surface on which the p-layer is to be deposited by conventional RF-PECVD. The p-layer itself is 10-12 nm thick. The respective i-layers are then separately deposited on each p-layer by DECR. The p-layers, 15-20 nm thick, were then simultaneously deposited on the i-layers by conventional RF-PECVD. Finally, aluminum contacts about 300 nm thick were evaporated onto the n-layers and back contacts. The process described ensured that the differences in the performance of the three cells was due substantially only to differences between their respective i-layers.

The intrinsic layers of the three cells were deposited as follows:

Cell 1: Intrinsic layer deposited with a constant silane flow (100 sscm for a period of 90 s).

Cell 2: Intrinsic layer deposited with 100 sscm at the beginning, then the silane flow was decreased by 10 sccm steps every 15 s down to 30 sccm (i.e. total deposition time is 120 s).

Cell 3: Intrinsic layer deposited with 100 sscm at the beginning, then the silane flow was decreased by 10 sccm steps every 20 s down to 30 sccm (i.e. total deposition time is 160 s).

Cells 2 and 3 were thus graded according to the present invention, and Cell 1 was not.

The bandgap profiles are illustrated in FIG. 6. Since the deposition rate decreases when the silane flow decreases, the bandgap steps become shorter and shorter due to the constant deposition time. The bandgap grading is therefore concentrated at the end of the intrinsic thickness, close to the n-layer. This is advantageous, because the holes generated there are the most difficult to collect because they must cross the whole intrinsic thickness before reaching the p-layer.

As seen in Table 2 below, which gives the performance of the cells when subjected to white light at an intensity of 100 mW/cm$^2$, the cells with a graded bandgap have a much better fill factor and a higher efficiency. The voltage generated by

TABLE 1

| Sample | SiH4 sccm | Bias V | Gas Pressure mTorr | Plasma Pressure mTorr | Thickness Å | Rate Å/s | Roughness Å | Band gap eV | C | $\epsilon_i$(max) |
|---|---|---|---|---|---|---|---|---|---|---|
| d220504-1 | 60 | −100 | 0.83 | 2.65 | 4916 | 16.4 | 4.4 | 1.84 | 2.2 | 23.1 |
| d220504-2 | 70 | −100 | 0.97 | 3.17 | 5558 | 18.5 | 5.1 | 1.82 | 2.2 | 23.7 |
| d220504-3 | 80 | −100 | 1.10 | 3.77 | 5104 | 21.3 | 6.9 | 1.81 | 2.1 | 23.6 |
| d220504-4 | 90 | −100 | 1.21 | 4.20 | 5616 | 23.4 | 5.8 | 1.80 | 2.3 | 23.7 |
| d220504-5 | 30 | −100 | 7.34 | 4.51 | 6502 | 12.0 | 3.1 | 1.87 | 2.1 | 22.3 |

Looking more specifically at the material bandgap Eg, it is obvious that it is influenced by the silane flow rate even if the pressure is artificially increased. The same applies to the maximum value of the imaginary part of the dielectric function $\epsilon_i$(max) as obtained from ellipsometry data by the Tauc-Lorentz model, for which values are given in the last column.

the cell stays the same, though the short-circuit current decreases because of the grading. However, in the third cell, the adverse effect of bandgap grading on the short circuit current is compensated by the thicker intrinsic layer, while the fill factor remains significantly higher than for the constant bandgap cell.

TABLE 2

|   |   | FF | Voc V | Jsc mA/cm2 | Efficiency |
|---|---|---|---|---|---|
| Cell 1 | cst. bandgap | 56% | 0.76 | 9.18 | 3.90% |
| Cell 2 | 15 s steps | 64% | 0.76 | 8.66 | 4.21% |
| Cell 3 | 20 s steps | 62% | 0.76 | 9.19 | 4.33% |

By way of further demonstration of the invention, four additional cells were made to further investigate the effect of bandgap grading and the thickness of the layers. PIN cells were deposited (the order of the letters PIN denoting the order in which the layers were deposited) under the same conditions (MW power 2 kW, nominal temperature 275° C., Bias −60V, 16 antennas) except that in three of the cells the silane flow rate was modified during the course of the deposition of the intrinsic layer to grade the bandgap.

Cell 4: Intrinsic layer deposited with a constant silane flow (100 sscm for a period of 90 s).

Cell 5: Intrinsic layer deposited with 100 sscm at the beginning, then the silane flow rate was decreased by 10 sccm steps.

Cell 6: Intrinsic layer Cell 5 but with a longer initial step at 100 sccm.

Cell 7: Intrinsic layer as Cell 5 but with a shorter initial step at 100 sccm.

Figure 9A:
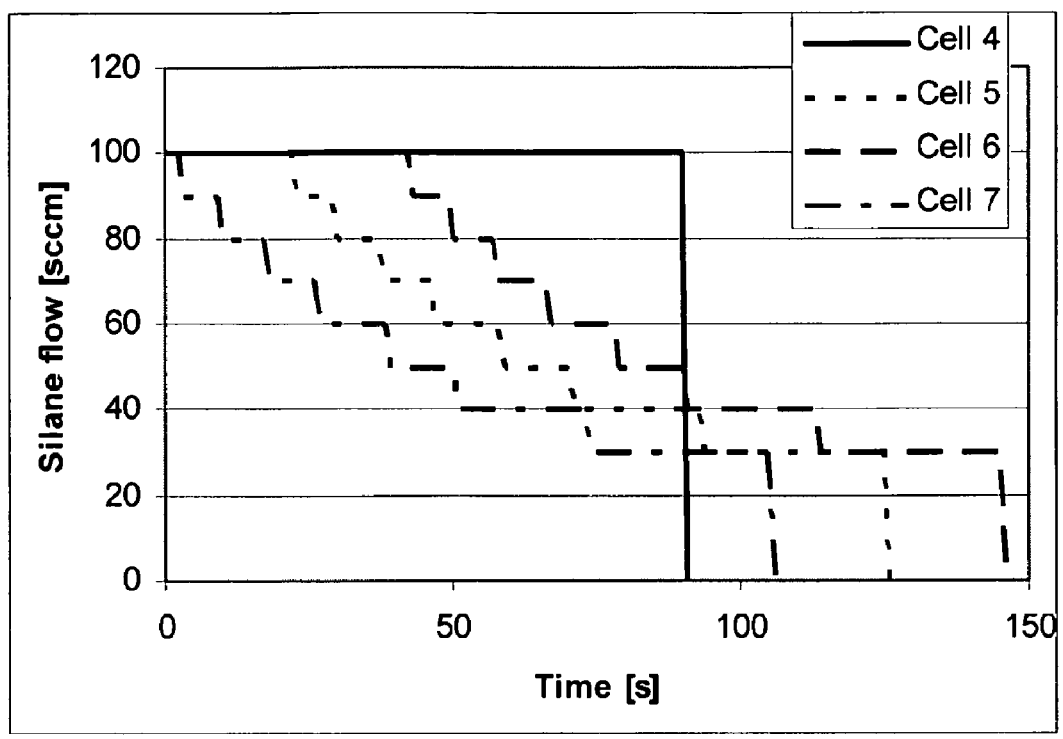
FIGS. 9a and 9b are graphs similar to FIG. 6, but of the four cells whose properties are shown in FIGS. 7 and 8, and with FIG. 9a plotted with respect to deposition time rather than deposition thickness.
Figure 9B:
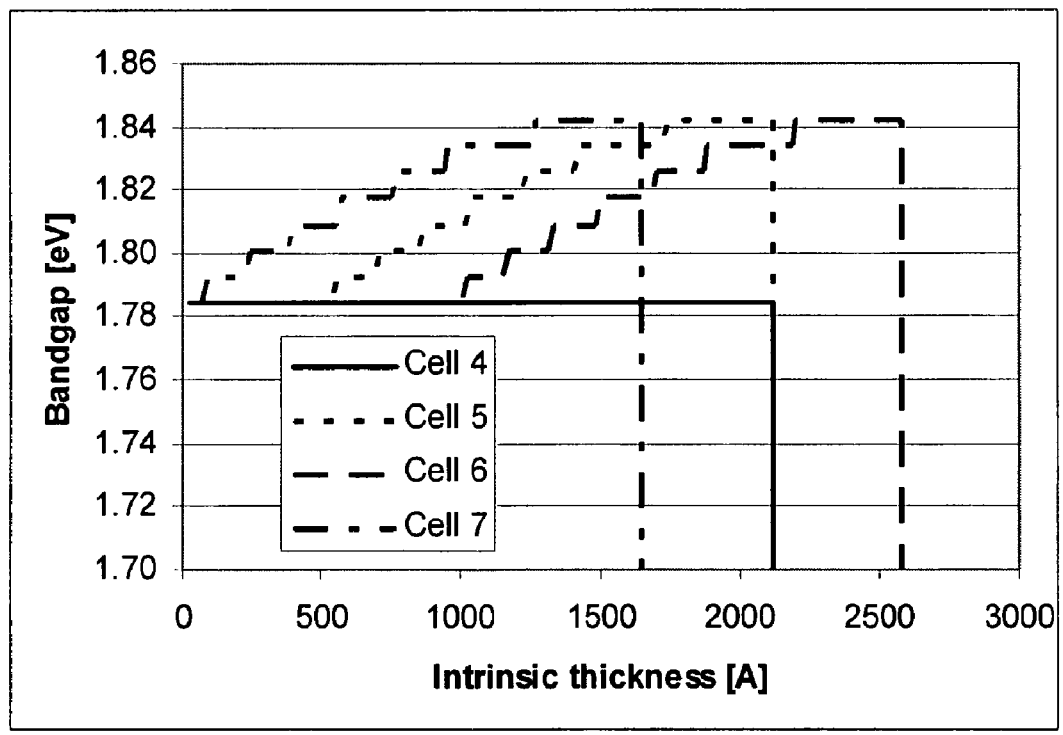
Figure 10:
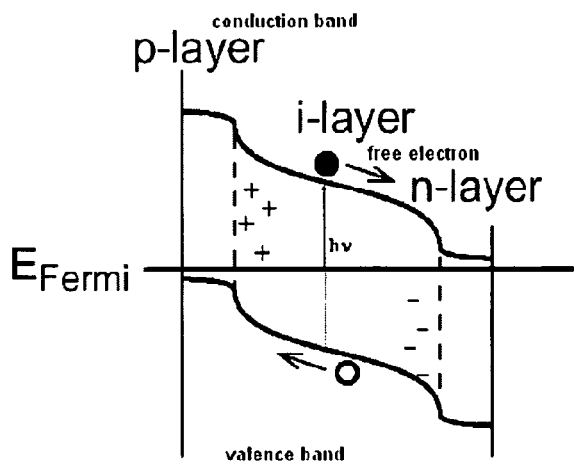
FIG. 10 is an energy band diagram of a solar cell illuminated through the p-layer.
Figure 11:
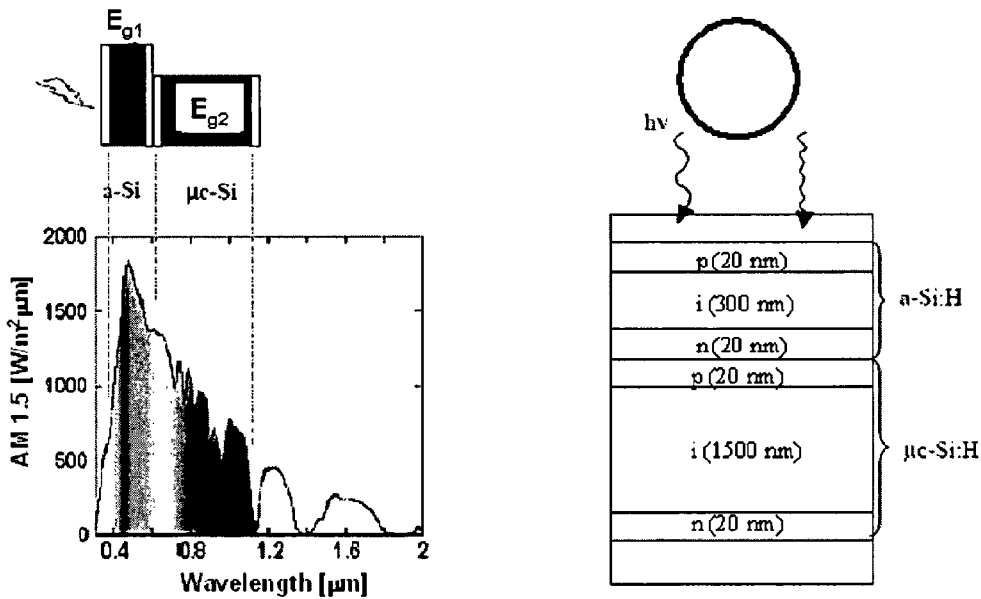
FIG. 11 is a schematic view of a multi junction solar cell device.
Figure 12:
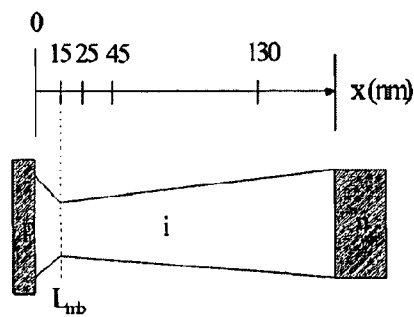
FIG. 12 is a schematic view of an asymmetric bandgap profile for a solar cell.

The bandgap profiles are plotted in FIGS. 9a and 9b against time and against thickness, respectively.

As seen in Table 3 below, comparing Cell 4 with Cell 5, the cell with a graded bandgap has a much better fill factor, even though the larger optical gap due to the grading results in a lower optical absorption. The open circuit voltage is substantially the same, though the short circuit current decreases because of the grading.

TABLE 3

|   |   | Intrinsic thick. [Å] | FF | Jsc [mA/cm2] | Voc [V] | Efficiency |
|---|---|---|---|---|---|---|
| Cell 4 | cst. bandgap | 2120 | 49% | 9.2 | 0.82 | 3.69% |
| Cell 5 | std. grading | 2119 | 58% | 8.4 | 0.81 | 3.91% |

Cells 5, 6 and 7 provide information as to the effect of altering the duration of the initial step, so as to change the overall intrinsic thickness. With a thicker initial intrinsic layer, the optical absorption of the long wavelength photons is promoted. Therefore, the effect of the bandgap grading is compensated by the thicker intrinsic layer, while the fill factor remains significantly higher than for the constant bandgap cell.

TABLE 4

|   |   | Intrinsic thick. [Å] | FF | Jsc [mA/cm2] | Voc [V] | Efficiency |
|---|---|---|---|---|---|---|
| Cell 7 | short grading | 1653 | 62% | 7.5 | 0.81 | 3.75% |
| Cell 5 | std. grading | 2119 | 58% | 8.4 | 0.81 | 3.91% |
| Cell 6 | long grading | 2585 | 55% | 9.1 | 0.82 | 4.08% |

As can be seen from Table 4 above, the short circuit current increases with the overall thickness of the layer due to the larger "initial" sub-layer (deposited during what is called the initial step). It is also very important to highlight that the fill factor remains quite high, relative to standard cells, despite shifting of the graded part in the cell, by the initial sub-layer, and Cell 6 achieves 4.08% efficiency. Thanks to the bandgap grading, a relative efficiency improvement as high as 11% has been achieved. (Cell 6 compared to Cell 4).

Figure 7:
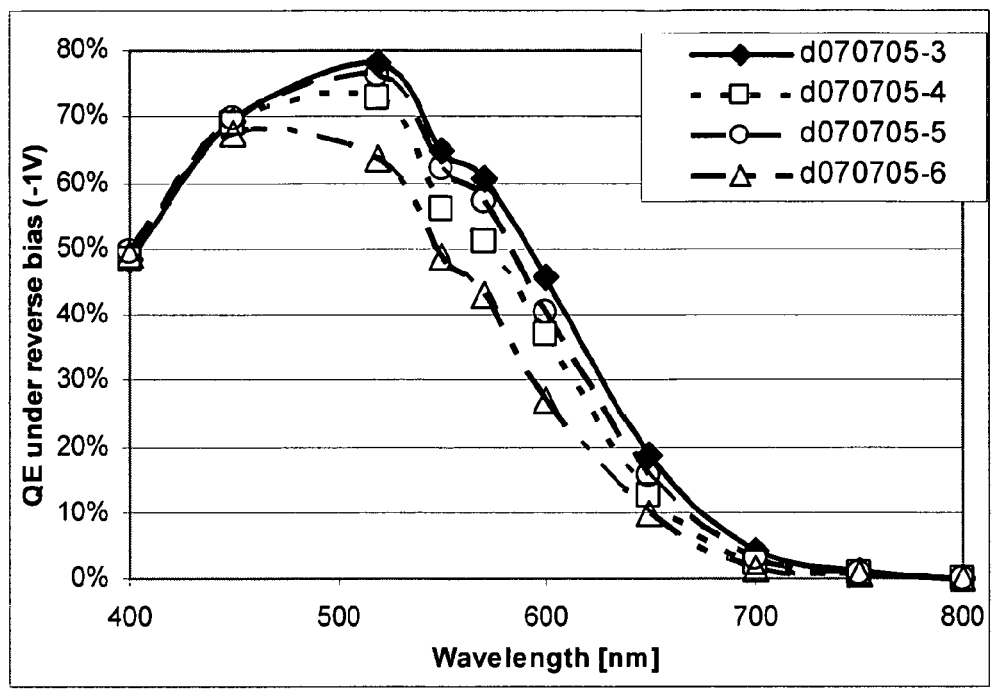
FIG. 7 shows the quantum efficiency under reverse bias of the four cells, three of which had a graded bandgap, and one did not, with respect to wavelength.
Figure 8:
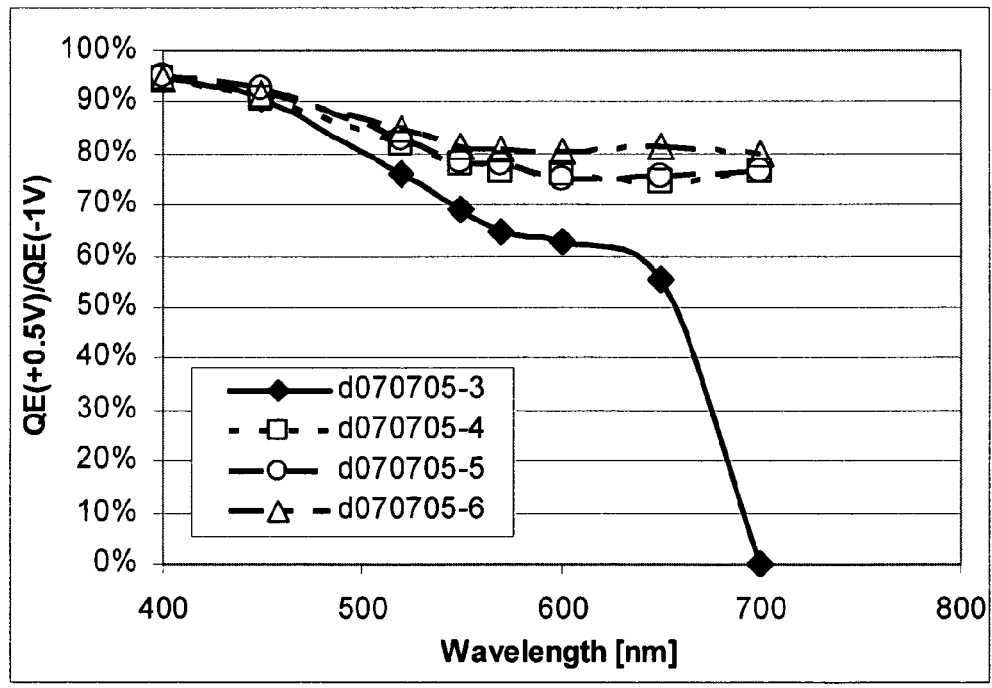
FIG. 8 is a graph showing the ratio of the quantum efficiency of the same four cells as in FIG. 7, under forward bias and at short-circuit.

The performance of cells 4, 5, 6 and 7 can be further understood from FIGS. 7 and 8. FIG. 7 is a graph comparing the quantum efficiency, under reverse bias, of the four cells.

The quantum efficiency is defined as the ratio, at specific photon energy, of the photocurrent density j ($A/cm^2$) to the incident photon flux f.

Because of this, comparing samples of different thickness can be misleading and this is what is seen more specifically when applying a negative (reverse) bias while performing the QE measurements. Applying a −1 V bias results in a very large increase of the electric field which then prevents the loss of photo-carriers to recombination and allows the collection of any carrier generated. At −1V reverse bias, the QE is mostly controlled by the layer absorption.

It will be observed that the constant bandgap cell (Cell 4) has the largest absorption, even though Cell 6 is much thicker. Obviously, the optical absorption decreases with thinner cells and the variation is particularly visible in the large wavelengths because the absorption coefficient decreases with the wavelengths.

On the other hand, applying a forward bias leads to the partial collapse of the electric field. The effect of a forward bias is illustrated by FIG. 8, which plots the ratio of the quantum efficiency under forward and reverse bias for the same four cells. The extent of the collapse will be a function of the initial electric field present in the cell and also the magnitude of the forward bias. The beneficial effect of the bandgap grading is very clear on the ratio between the currents collected under forward (+0.5V) and reverse bias (−1V). Grading the bandgap makes it possible to keep a good collection of the carriers under forward bias even when those are generated by larger wavelengths, hence further from the P/I interface.

It is clearly seen in FIG. 8 that charge collection is very poor at long wavelength, when the charges are generated far away from the P/I interface, unless under forward bias conditions.

The invention claimed is:

1. A method of forming a film of an amorphous material on a substrate by deposition of a plasma, the method comprising the steps of:
    placing the substrate in an enclosure,
    continuously introducing into the enclosure a film precursor gas at a flow rate, the film precursor gas containing one component or multiple components,
    extracting unreacted and dissociated gas from the enclosure so as to provide a low pressure in the enclosure,
    introducing microwave energy into the gas within the enclosure to produce a plasma therein by distributed electron cyclotron resonance (DECR) and cause the material to be deposited from the plasma on the substrate,
    wherein the said flow rate is altered during the course of deposition of material without varying the overall composition of the film precursor gas introduced into the enclosure, so as to cause the bandgap to vary over the thickness of the deposited material.

2. The method according to claim 1, wherein the film is hydrogenated amorphous silicon.

3. The method according to claim 2, wherein the film precursor gas comprises a silicon hydride.

4. The method according to claim 3, wherein the film precursor gas comprises $SiH_4$.

5. The method according to claim 1, wherein the film deposited is an amorphous silicon alloy.

6. The method according to claim 1, wherein the plasma is produced by devices arranged to form a two-dimensional network.

7. The method according to claim 6, wherein the plasma is produced by matrix DECR.

8. The method according to claim 1, wherein the bandgap of the film is caused to vary continuously and steplessly through all or part of its thickness, by varying the flow rate in continuous, stepless fashion.

9. A method of making a solar cell, wherein the film of amorphous material is formed by the method of claim 1 on a substrate of an n-doped material, and a layer of a p-doped material is formed on the film of amorphous material.

10. A method of making a solar cell, wherein the film of amorphous material is formed by the method of claim 1 on a substrate of a p-doped material, and a layer of an n-doped material is formed on the film of amorphous material.

11. A method of forming a film of an amorphous material on a substrate by deposition of a plasma, the method comprising the steps of:

placing the substrate in an enclosure, continuously introducing into the enclosure a film precursor gas at a flow rate, the film precursor gas containing one component or multiple components, extracting unreacted and dissociated gas from the enclosure so as to provide a low pressure in the enclosure, introducing microwave energy into the gas within the enclosure to produce a plasma therein by distributed electron cyclotron resonance (DECR) and cause the material to be deposited from the plasma on the substrate, wherein the said flow rate is altered during the course of deposition of material without varying the composition of the gas introduced into the enclosure, so as to cause the bandgap to vary over the thickness of the deposited material and a plurality of layers are successively deposited on the substrate, each layer having a larger bandgap than the previous layer.

12. A method of forming a film of an amorphous material on a substrate by deposition of a plasma, the method comprising the steps of:

placing the substrate in an enclosure, continuously introducing into the enclosure a film precursor gas at a flow rate, the film precursor gas containing one component or multiple components, extracting unreacted and dissociated gas from the enclosure so as to provide a low pressure in the enclosure, introducing microwave energy into the gas within the enclosure to produce a plasma therein by distributed electron cyclotron resonance (DECR) and cause the material to be deposited from the plasma on the substrate, wherein the said flow rate is altered during the course of deposition of material without varying the composition of the gas introduced into the enclosure, so as to cause the bandgap to vary over the thickness of the deposited material and a plurality of layers are successively deposited on the substrate, each layer having a smaller bandgap than the previous layer.

13. A method of forming a film of an amorphous material on a substrate by deposition of a plasma, the method comprising the steps of:

placing the substrate in an enclosure, continuously introducing into the enclosure a film precursor gas at a flow rate, the film precursor gas containing one component or multiple components, extracting unreacted and dissociated gas from the enclosure so as to provide a low pressure in the enclosure, introducing microwave energy into the gas within the enclosure to produce a plasma therein by distributed electron cyclotron resonance (DECR) and cause the material to be deposited from the plasma on the substrate, wherein the said flow rate is altered during the course of deposition of material without varying the composition of the gas introduced into the enclosure, so as to cause the bandgap to vary over the thickness of the deposited material and the layers are deposited so as to cause the bandgap to have a minimum at a point spaced from both the first and last layers to be deposited.

* * * * *